(12) United States Patent
Qian et al.

(10) Patent No.: US 10,882,258 B1
(45) Date of Patent: Jan. 5, 2021

(54) MICROCHIP AFFIXING PROBE AND METHOD OF USE

(71) Applicant: PharmaSeq, Inc., Monmouth Junction, NJ (US)

(72) Inventors: Ziye Jay Qian, Monroe Township, NJ (US); Wlodek Mandecki, Princeton Junction, NJ (US)

(73) Assignee: PharmaSeq, Inc., Monmouth Junction, NJ (US)

( * ) Notice: Subject to any disclaimer, the term of this patent is extended or adjusted under 35 U.S.C. 154(b) by 737 days.

(21) Appl. No.: 15/410,189

(22) Filed: Jan. 19, 2017

Related U.S. Application Data

(60) Provisional application No. 62/286,001, filed on Jan. 22, 2016.

(51) Int. Cl.
| | | |
|---|---|---|
| *B29C 65/00* | (2006.01) | |
| *B29C 65/02* | (2006.01) | |
| *H01L 21/683* | (2006.01) | |
| *H01L 21/67* | (2006.01) | |
| *H01L 23/544* | (2006.01) | |
| *H01L 23/498* | (2006.01) | |
| *B29L 31/34* | (2006.01) | |

(52) U.S. Cl.
CPC ............ *B29C 66/863* (2013.01); *B29C 65/02* (2013.01); *H01L 21/67132* (2013.01); *H01L 21/6838* (2013.01); *H01L 23/49855* (2013.01); *H01L 23/544* (2013.01); *B29L 2031/34* (2013.01); *H01L 2223/54413* (2013.01)

(58) Field of Classification Search
CPC . B29C 66/863; B29C 65/02; H01L 21/67132; H01L 23/544; H01L 21/6838; H01L 23/49855; H01L 2223/54413; B29L 2031/34
See application file for complete search history.

(56) References Cited

U.S. PATENT DOCUMENTS 6,016,949 A * 1/2000 Slesinger ........... B23K 37/0435
                                                 228/180.22
8,353,917 B2   1/2013 Mandecki et al.
(Continued)

OTHER PUBLICATIONS

Mandecki, et al.; "Tagging of Small Containers for Biological and Chemical Samples with Light-Activated Microtransponders"; U.S. Appl. No. 13/239,779, filed Sep. 22, 2011.
(Continued)

*Primary Examiner* — Michael N Orlando
*Assistant Examiner* — Cynthia L Schaller
(74) *Attorney, Agent, or Firm* — Moser Taboada

(57) ABSTRACT

Provided among other things is a method of affixing a small, single chip to a plastic item, the chip having a top surface having length and width dimensions, and having a height, the method comprising: (1) vacuum adhering a top-oriented surface of the chip to a probe of outer dimensions comparable to or smaller than those of the length and width; (2) conveying heat to the chip via the probe such that a bottom-oriented surface of the chip is sufficiently hot to melt the plastic; (3) applying via the probe the chip to the plastic such that the chip embeds in the plastic; and (4) releasing the chip from the probe, wherein the largest of the length and width is about 500 microns or less, and height is no more than about the smallest of length and width.

9 Claims, 2 Drawing Sheets

(56) References Cited

U.S. PATENT DOCUMENTS

| | | | |
|---|---|---|---|
| 9,418,321 B1 | 8/2016 | Gruda et al. | |
| 2004/0052203 A1* | 3/2004 | Brollier | G06K 19/045 |
| | | | 369/273 |
| 2005/0242963 A1* | 11/2005 | Oldham | B01L 3/545 |
| | | | 340/572.8 |
| 2007/0141760 A1* | 6/2007 | Ferguson | H01L 24/19 |
| | | | 438/127 |
| 2013/0255079 A1* | 10/2013 | Maijala | B23K 1/0016 |
| | | | 29/832 |
| 2019/0195745 A1* | 6/2019 | Hendrickx | B65D 25/205 |

OTHER PUBLICATIONS

Mandecki, et al.; "All Optical Identification and Sensor System with Power on Discovery"; U.S. Appl. No. 14/631,321, filed Feb. 25, 2015.

* cited by examiner

MICROCHIP AFFIXING PROBE AND METHOD OF USE

This application claims priority to U.S. Appn. No. 62/286,001, filed 22 Jan. 2016.

The present application relates generally to a microchip affixing probe, and a method of using it to affix microchips to plastic.

Silicon-based, single chips with for example largest dimension (e.g., length, width or height) of 500 microns or less can be very difficult to affix to plastic items. For example, in biorepositories, it can be important to have such a microtransponder tag on each storage tube. The attachment of the microtransponder to the item must be suitably strong, reliable and durable.

Such small single chips include light-triggered microtransponders ("MTP" or "p-Chip" microtransponder), such as described in U.S. Pat. No. 7,098,394 (incorporated herein by reference in its entirety). These are available to provide identifiers, for example as identifiers for each test tube, tissue cassette, or another plastic item. MTPs can include those that are triggered by light, and emit a light signal (see U.S. Pat. Appn. 61/944,305, filed 25 Feb. 2014, and U.S. Pat. Pub. 2018/0091224 filed 25 Feb. 2015, both incorporated herein by reference in their entirety).

Disclosed herein are methods and devices for very simply affixing single chips of these dimensions onto plastic items.

SUMMARY

Provided is a method of affixing a small, single chip to a plastic item, the chip having a top surface having length and width dimensions, and having a height, the method comprising: (1) vacuum adhering a top-oriented surface of the chip to a probe of outer dimensions comparable to or smaller than those of the length and width; (2) conveying heat to the chip via the probe such that a bottom-oriented surface of the chip is sufficiently hot to melt the plastic; (3) applying via the probe the chip to the plastic such that the chip embeds in the plastic; and (4) releasing the chip from the probe, wherein the largest of the length and width is about 500 microns or less, and height is comparable to or less than about the smallest of length and width. The embedding can be to about a fraction of the height of the chip, to about the height of the chip, or deeper. By "comparable to" with respect to probe size, it is meant that the size is such that alignment issues can be readily calculated by a controller utilizing optical data, and the size is no more than about 2× the size of the chip. In embodiments, the probe outer dimensions comparable to or smaller than those of the length and width. By "comparable to" with respect to chip height, it is meant that height is no more than about 120% the smallest of length and width.

In embodiments, the chips are serially applied to individual plastic items, the method further comprising: (5) serially conveying chips with a designated top surface to a station for the probe; (6) as chips are at or approach the probe station, optically confirming whether the designated top surface is top-oriented; and (7) serially selectively conducting said vacuum adhering, conveying, applying and releasing with those chips where the designated top surface is top-oriented.

In embodiments, the plastic to which the chip is affixed is polypropylene. In embodiments, the plastic to which the chip is affixed has a melting temperature of from about 140 to about 180° C., and the probe heats the chip to a temperature about 20 to about 50° C. above the melting temperature.

In embodiments, the above recited steps are conducted robotically. In embodiments, the chip is affixed in the midst of a 2D bar code, and wherein the bar code remains machine readable, such a bar code can be for example about 4 mm×4 mm or smaller.

Also provided is a microchip affixing probe comprising: (A) a heating element; (B) a vacuum-conveying probe having an operative tip with length and width dimensions that are each about 600 micron or less (such as about 500 micron or less); and (C) a heat-conducting link between the heating element and the probe, wherein the probe is effective to vacuum adhere the microchip and to heat the microchip to a temperature between about 160° C. and about 230° C., wherein the microchip has length and width of which the largest is about 500 microns or less, and has height that is comparable to or less than about the smallest of length and width.

Further provided is a robotic system comprising: the microprobe; a vibrational conveyor configured to move microchips having a top surface and wherein the largest of the length and width thereof is about 500 microns or less, and height thereof is comparable to or less than about the smallest of length and width; one or more detectors for the location and orientation of microchips on the conveyor; robotic control for releasably affixing a individual microchip to the probe when such microchip is detected to be in a pick-up zone, oriented with the top surface up and sufficiently separated from other chips for pick-up; robotic control for conveying with the probe a releasably affixed a individual microchip to an application location and heat embedding the microchip into a plastic receiver at the application location; and robotic control for conveying the probe sansmicro chip back to the pick-up zone to repeat the affixing process. The system can for example further comprise one or more detectors operative with first conveying robotic control to locate the probe and/or the plastic receiver as they approach each other. The system can for example further comprise one or more detectors operative with affixing robotic control to locate the probe and/or the individual microchip as they approach each other.

DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only illustrative embodiments of this invention and are therefore not to be considered limiting of its scope, for the invention may admit to other equally effective embodiments.

Figure 1A:
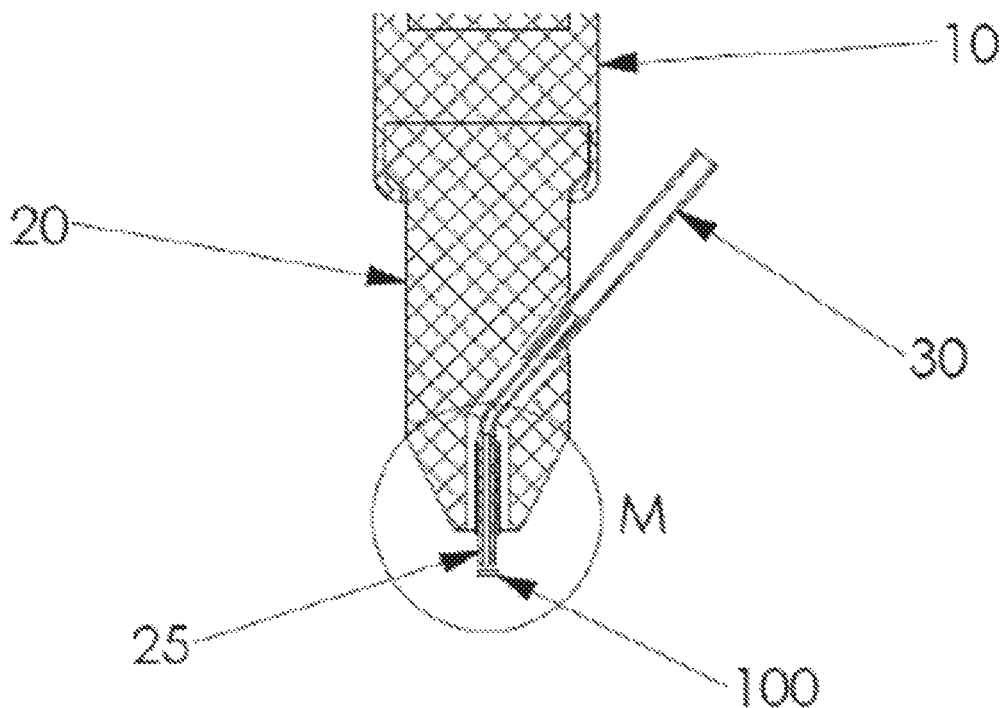
FIG. 1A depicts a microchip affixing probe.

To facilitate understanding, identical reference numerals have been used, where possible, to designate comparable elements that are common to the figures. The figures are not drawn to scale and may be simplified for clarity. It is contemplated that elements and features of one embodiment may be beneficially incorporated in other embodiments without further recitation.

DETAILED DESCRIPTION

Figure 1B:
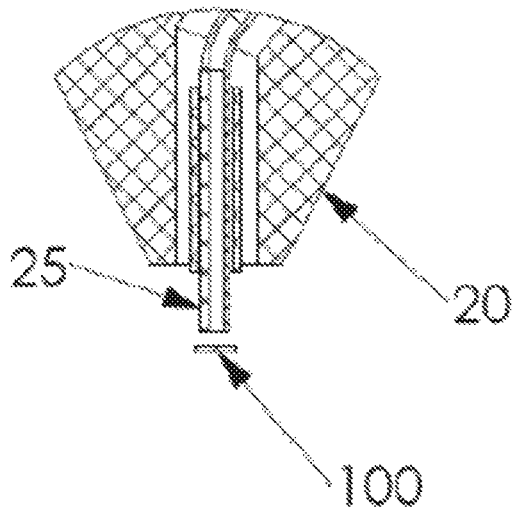
FIG. 1B is a blow-up of the tip of the microchip affixing probe, as indicated in FIG. 1A.

A microchip affixing probe 50 is shown in FIG. 1. It includes a heating element 10. The heating element can be for example one taken from a soldering iron. Affixed to the heating element 10 is a hollow extension 20 that includes a hollow probe 25 of outer dimensions comparable to or smaller than those of the length and width of the illustrated micro chip 100. Vacuum is applied to the hollow extension with connected hollow probe via vacuum inlet 30. Vacuum adheres the microchip 100 to the probe 25. (The hollow extension is hollow in the sense that it has at least a channel linking the vacuum inlet to the hollow probe.)

Heat is transferred to the microchip via the hollow extension 20 (with hollow probe 25). The temperature can be monitored by for example controller 150 using one or temperature probes located to provide an experimentally established surrogate for the temperature at the micro chip 100 or at the tip of the hollow probe 25. The probes can be thermocouples, thermistors or the like; or can be IR monitors including cameras.

The controller 150 can use the temperature data to control the operation of the heating element 10, such as by controlling the amount of energy provided to the heating element. Though the heat capacity of the microchip 100 is small, in some embodiments the heat may be boosted somewhat as the probe 50 is about to pick up a microchip 100.

The method can present the microchips 100 to the microchip affixing probe with for example the vibration-dependent movement and segregation methods embodied in the machines available from Electrosort Automation (Easton, Pa.). Chips are moved with vibrational energy until they move individually (i.e., are physically separate), at which point orientation can be assessed optically (including visually). Chips that present with the wrong orientation can be returned to the sorting pool with either robotically flipped orientation or with random orientation.

In embodiments, the method is effective to affix 10 chips per minute or more to plastic items.

Controller

Figure 2:
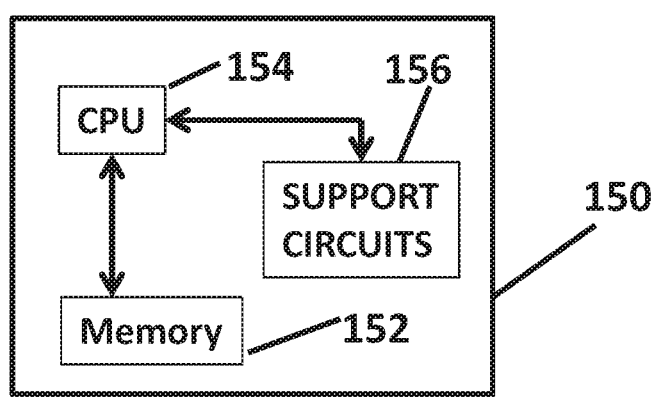
FIG. 2 is a schematic of a controller.

The probe 50 can have a controller 150 (illustrated in FIG. 2), which can comprise a central processing unit (CPU) 154, a memory 152, and support circuits 156 for the CPU 154 and is coupled to and controls the synthesizer or, alternatively, operates to do so in conjunction with computers (or controllers) connected to the synthesizer. CPU 154 may be realized as a general purpose CISC, RISC or other traditional microprocessor architecture, or it may be realized as a FPGA.

For example, another electronic device can supply software, or operations may be calculated off-site with controller 150 coordinating off-site operations with the local environment. The controller 150 may be one of any form of general-purpose computer processor, state machine, or an array of processors, that can be used for controlling various devices and sub-processors. The memory, or computer-readable medium, 152 of the CPU 54 may be one or more of readily available memory technologies such as random access memory (RAM), read only memory (ROM), flash memory, floppy disk, hard disk, ReRAM, magnetic memory, or any other form of digital storage, local or remote. The support circuits 156 are coupled to the CPU 154 for supporting the processor in a conventional manner. These circuits can include cache, power supplies, clock circuits, address decoders, input/output circuitry and subsystems, and the like. Methods of operating the synthesizer may be stored in the memory 152 as software code that may be executed or invoked to control the operation of the synthesizer. The software may also be stored and/or executed by a second CPU (not shown) that is remotely located from the hardware being controlled by the CPU 154. While the above discussion may speak of the "controller" taking certain actions, it will be recognized that it may take such action in conjunction with connected devices.

Though not illustrated, the controller, or controller subparts, can be operatively connected to the sensors, heating elements, robotic movement elements and the like of probe 50.

Programming

Robotic alignment of the probe with the chip can be controlled by feedback from video or photo inputs, such that the probe aligns with the chip sufficiently for vacuum pickup. In embodiments, alignment is adjusted as the probe nears the chip, such that for example a pick-up alignment is achieved even if the chip is subject to small scale movement during the time frame for the pick-up process.

During the pick up phase, vacuum can be on, or turned on (such as by activating or deactivating an appropriate solenoid) when the probe nears or contacts the chip. During the release phase, vacuum is turned off. Turning off the vacuum, and some embodiments applying pressure through hollow probe 25, can help avoid having melted plastic absorb on the probe. For example, a 3-way solenoid can switch the hollow extension 20 to positive pressure of about 7-10 psi. This can help to clean the channel of any plastic residue.

In embodiments utilizing robotic movement of the adhered chip to plastic substrate, alignment can also for example be subject to feedback control from video or photo inputs. Typically, the plastic substrate is robotically moved to a location designated for affixing the chip. Nonetheless, the plastic substrate may be subject to some alignment issues even within the relatively narrow boundaries provided by its robotic positioning. Thus, even here feedback control can be useful.

Typically, the hollow probe 25 is held at a set temperature, which can differ for different plastic materials.

The controller can set an adjustable minimum amount of time needed for the chip to contact the probe before being affixed to the plastic.

The alignment to the plastic substrate includes alignment depth. Typically, the chip is inserted into (melts into) the plastic to a depth of about the height of the chip or somewhat more. In embodiments, the total depth to the bottom of the chip is about 10% to about 300% of chip height relative to the surface of the plastic substrate, such as about 90% to about 120%. (Recall that the chip is vacuum affixed by the L×W area, with H designating the $3^{rd}$ dimension of the chip.) Again, video or photo feedback data can be used to refine this alignment.

A robot's movement speed can be changed during the motion as regulated by feedback from video or photo inputs. For example, there can be two speeds. When the probe with chip approaches the plastic surface to certain height, such as 0.9 mm, robot uses slower speed to affix chip to plastic so chip will not be crashed into the plastic.

All ranges recited herein include ranges therebetween, and can be inclusive or exclusive of the endpoints. Optional included ranges are from integer values therebetween (or inclusive of one original endpoint), at the order of magnitude recited or the next smaller order of magnitude. For example, if the lower range value is 0.2, optional included endpoints can be 0.3, 0.4, . . . 1.1, 1.2, and the like, as well as 1, 2, 3 and the like; if the higher range is 8, optional included endpoints can be 7, 6, and the like, as well as 7.9, 7.8, and the like. One-sided boundaries, such as 3 or more, similarly include consistent boundaries (or ranges) starting at integer values at the recited order of magnitude or one lower. For example, 3 or more includes 4 or more, or 3.1 or more. If there are two ranges mentioned, such as about 1 to 10 and about 2 to 5, those of skill will recognize that the implied ranges of 1 to 5 and 2 to 10 are within the invention.

Where a sentence states that its subject is found in embodiments, or in certain embodiments, or in the like, it is applicable to any embodiment in which the subject matter can be logically applied.

This invention described herein is of a microchip affixing probe and methods of using the same. Although some embodiments have been discussed above, other implementations and applications are also within the scope of the following claims. Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the following claims.

Publications and references, including but not limited to patents and patent applications, cited in this specification are herein incorporated by reference in their entirety in the entire portion cited as if each individual publication or reference were specifically and individually indicated to be incorporated by reference herein as being fully set forth. Any patent application to which this application claims priority is also incorporated by reference herein in the manner described above for publications and references.

What is claimed is:

1. A method of affixing small, single chips, each chip fully defining a light triggered transponder having a light responsive face, to storage devices for biological material, each storage device structurally consisting of a plastic material and having one or more walls of said plastic material, each said chip having a top surface with the light responsive face having length and width dimensions, each said chip having a bottom surface and having a height, the method comprising robotically:

serially conveying the chips to a station for a probe;

as the chips are at or approach the probe station, optically confirming whether the light responsive face of each said chip is top-oriented;

serially selectively conducting the following for each said chip:

vacuum adhering the top surface of the chip to a probe of outer dimensions comparable to or smaller than the chip top surface length and width;

conveying heat to the chip via the probe such that the bottom surface of the chip is sufficiently hot to melt the plastic material, the plastic material having a melting temperature from about 140° C. to about 180° C.;

applying via the probe the bottom surface of the chip directly to the plastic material of an exterior wall of said one or more walls such that the plastic material melts from contact with the heated chip to thereby embed the chip into the plastic material to a depth of more than the chip height to about 300% of the chip height; and releasing the chip from the probe leaving the chip embedded in and affixed to the exterior wall of the storage device, wherein a largest of the chip top surface length and width is about 500 microns or less, and the chip height is comparable to or less than about a smallest of the chip top surface length and width; and obtaining the storage device with the light responsive transponder effective to provide an ID when triggered by appropriate light aimed at the chip.

2. The method of claim 1, wherein the method is effective, per probe, to affix about 10 chips per minute or more to plastic items.

3. The method of claim 1, wherein the plastic material to which the chip is affixed is polypropylene.

4. The method of claim 1 wherein the probe heats the chip to a temperature about 20 to about 50° C. above the melting temperature of the plastic material.

5. The method of claim 1, wherein, for each serial iteration, the chip is affixed in the midst of a 2D bar code previously provided on the exterior wall of the storage device, and wherein the bar code remains machine readable.

6. The method of claim 5, wherein the 2D bar code is about 4 mm×4 mm or smaller.

7. The method of claim 1, wherein the storage devices are storage tubes.

8. The method of claim 1, wherein the storage devices are test tubes.

9. The method of claim 1, wherein the storage devices are tissue cassettes.

* * * * *